OPERATIONAL AMPLIFIER WITH IMPROVED DRIVE MEANS
Filed Dec. 9, 1966
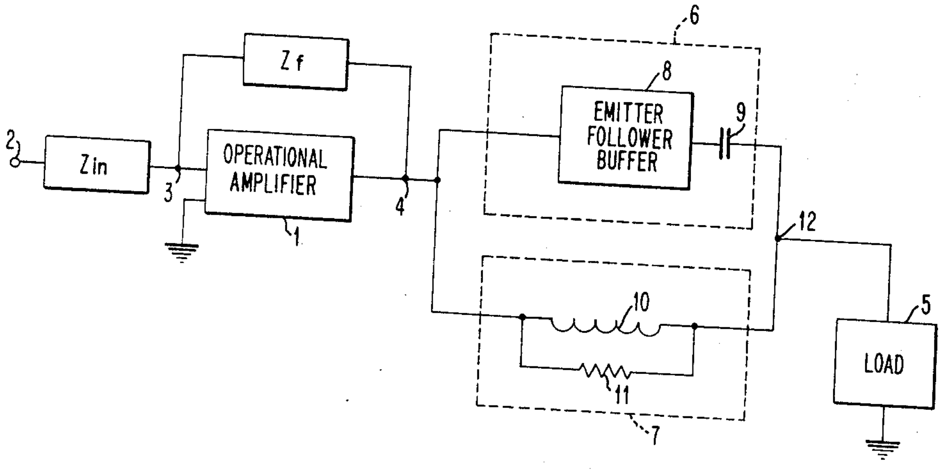
INVENTORS
JAMES C. GREESON JR.
JAMES J. KENNEDY
BY John C Black
ATTORNEY 3,408,585

OPERATIONAL AMPLIFIER WITH IMPROVED DRIVE MEANS

James C. Greeson, Jr., Woodstock, N.Y., and James J. Kennedy, Rochester, Minn., assignors to International Business Machines Corporation, Armonk, N.Y., a corporation of New York Filed Dec. 9, 1966, Ser. No. 600,496
3 Claims. (Cl. 330—20)

The present invention relates to an improved drive means for coupling the output of an operational amplifier to a reactive load while maintaining amplifier stability.

In a preferred form, the output of an operational amplifier is coupled to a reactive load by means of a first signal path including a series-connected emitter follower transistor amplifier and capacitor and a second parallel signal path including a parallel-connected inductor and resistor.

The concept of the operational amplifier is well known—i.e., a high gain amplifier having a negative feedback impedance connected between the input and output terminals, and further including one or more input series resistors for coupling input voltages to the input of the amplifier. The series and feedback resistors are generally precision resistors since the accuracy of the amplifier is limited only by the tolerance of these components. The open loop gain of the amplifier can be made sufficiently high so that the affect of the amplifier on the closed loop gain is substantially negligible.

In applying operational amplifiers in an actual machine environment, one of the more serious difficulties encountered is that of oscillations caused by the reactive loading of the circuit. The strong negative feedback around the operational amplifier is of necessity close to becoming unstable for certain external input and feedback networks. Adding reactive loading at the output in such a situation is often enough to push the operational amplifier into oscillation. Conventional solutions to this problem involve driving the open loop output impedance sufficiently low for a specific reactive load that the likelihood of instability for that reactive load is low. However, it can be appreciated that once the design is fixed there is some reactive load which will always cause the amplifier to go into oscillation because the output impedance of the operational amplifier cannot be made zero.

It is practically impossible to guarantee a design for particular loading characteristics in an actual machine environment. Consequently, it is necessary that an operational amplifier be designed to be as impervious to reactive loading as possible.

It is therefore an object of the present invention to provide an improved means for coupling the amplifier to an output load so that the amplifier can drive any reactance because the reactance is isolated from the operational amplifier output.

In a preferred embodiment of the present invention, the above object is achieved by driving the feedback impedance network and the reactive load from different points rather than, as in the past, driving the feedback network and the reactive load from the same point. A buffer stage, connected to the output of the amplifier, isolates the negative feedback network on an A.C. (alternating current) basis without disturbing the desirable D.C. (direct current) properties of the amplifier. The buffer stage includes an emitter follower transistor amplifier and a capacitor connected in series. An inductive element is connected in parallel with the series-connected emitter follower and capacitor.

At low frequencies, the input and output terminals of the buffer stage are for all practical purposes connected together by the inductor, while the load at the output of the buffer stage is isolated from the high frequency drive buffer by the capacitor.

At high frequencies, the input terminal of the buffer stage is isolated from the output terminal of the buffer stage by the inductive element, while the output terminal of the buffer stage is connected to the output of the emitter follower buffer by means of the capacitor. A resistor connected in parallel with the inductive element inhibits any tendency of the inductive element and the capacitor to oscillate at their resonant frequency.

The foregoing and other objects, features and advantages of the invention will be apparent from the following more particular description of a preferred embodiment of the invention, as illustrated in the accompanying drawing.

In the drawing:

The single figure illustrates a preferred form of the improved drive circuit partly in diagrammatic form and partly in schematic form.

As seen in the drawing, an operational amplifier 1 includes a series impedance *Zin* coupling and input terminal 2 to an amplifier input terminal 3. A negative feedback impedance *Zf* couples the input terminal 3 to an amplifier output terminal 4.

The terminal 4 is coupled to a load 5 by way of parallel high frequency and low frequency paths 6 and 7 respectively.

The high frequency path 6 includes an amplifier buffer 8, e.g., an emitter follower circuit and a series capacitor 9. The buffer isolates the feedback impedance *Zf* from the load 5 at high frequencies. The series capacitor blocks low frequencies from the path 6.

The low frequency path 7 includes a parallel-connected inductor 10 and resistor 11. The inductor effectively couples the amplifier output terminal 4 to a load driving output terminal 12 at low frequencies. At high frequencies, the inductor isolates terminal 12 from terminal 4.

Thus, at high frequencies where instability is likely to occur, terminal 12 is isolated from the negative drive terminal 4 by both the high and low frequency paths, while the desirable D.C. properties of the amplifier are essentially undisturbed since terminals 4 and 12 are essentially connected together at low frequencies.

The resistor 11 inhibits any tendency for oscillation by capacitor 9 and inductor 10 at their resonant frequency.

Excellent results were achieved in one implementation utilizing components having the following values, it being understood that the values are given merely by way of example:

| | | Value |
|---|---|---|
| Capacitor **9** | microfarad | .01 |
| Inductor **10** | microhenries | 10 |
| Resistors: | | |
| *Zin* | ohms | 2,000 |
| *Zf* | do | 20,000 |
| **7** | do | 30 |

With the improved drive circuit, one amplifier design can be utilized to drive various loads with widely differing reactance values.

While the invention has been particularly shown and described with reference to a preferred embodiment thereof, it will be understood by those skilled in the art that various changes in form and details may be made therein without departing from the spirit and scope of the invention.

What is claimed is:

1. In combination with an operational amplifier having input and negative feedback impedances, circuit means for coupling the output of the amplifier to various reactive load impedances without disturbing amplifier stability, said circuit means being characterized by:

a first signal path including a series-connected capacitor and an active buffer device coupling high frequency signals from the amplifier output to the load and blocking low frequency signals; and a second signal path including an inductive element coupling low frequency signals from the amplifier output to the load and blocking high frequency signals.

2. The combination set forth in claim 1 wherein the first signal path includes an emitter follower transistor amplifier having its input coupled to the output of the operational amplifier and its output coupled to the capacitor.

3. The combination set forth in claim 2 wherein the second signal path further comprises a resistor connected in parallel with the inductive element to inhibit resonant oscillation by the capacitor and the inductive element.

No references cited.

JOHN KOMINSKI, *Primary Examiner.*